(12) United States Patent
Teranaka

(10) Patent No.: US 8,599,555 B2
(45) Date of Patent: *Dec. 3, 2013

(54) ROBOT CONTROL DEVICE AND ROBOT SYSTEM

(75) Inventor: Ryosuke Teranaka, Suwa (JP)

(73) Assignee: Seiko Epson Corporation (JP)

( * ) Notice: Subject to any disclaimer, the term of this patent is extended or adjusted under 35 U.S.C. 154(b) by 289 days.

This patent is subject to a terminal disclaimer.

(21) Appl. No.: 12/823,517

(22) Filed: Jun. 25, 2010

(65) Prior Publication Data

US 2010/0262285 A1    Oct. 14, 2010

Related U.S. Application Data

(63) Continuation of application No. 11/605,493, filed on Nov. 28, 2006, now Pat. No. 7,769,489.

(30) Foreign Application Priority Data

Nov. 29, 2005 (JP) ................................. 2005-344651
Jun. 20, 2006 (JP) ................................. 2006-170736

(51) Int. Cl.
*H05K 7/20*    (2006.01)
(52) U.S. Cl.
USPC ............ 361/690; 361/694; 361/695; 700/245
(58) Field of Classification Search
USPC ............ 700/245, 250, 255; 318/34, 567, 652; 361/652, 692, 695, 712, 752
See application file for complete search history.

(56) References Cited

U.S. PATENT DOCUMENTS

| | | | | |
|---|---|---|---|---|
| 3,096,046 A | * | 7/1963 | Kendall, Jr. et al. | 244/17.13 |
| 5,282,114 A | * | 1/1994 | Stone | 361/679.51 |
| 5,398,161 A | * | 3/1995 | Roy | 361/727 |
| 5,508,908 A | * | 4/1996 | Kazama et al. | 363/141 |
| 5,680,295 A | * | 10/1997 | Le et al. | 361/695 |
| 5,684,674 A | * | 11/1997 | Yin | 361/695 |
| 5,721,670 A | * | 2/1998 | Cochrane et al. | 361/695 |
| 6,005,770 A | * | 12/1999 | Schmitt | 361/695 |
| 6,152,819 A | * | 11/2000 | Sasaki et al. | 454/184 |
| 6,292,363 B1 | * | 9/2001 | Shinohara et al. | 361/695 |
| 6,356,444 B1 | * | 3/2002 | Pedoeem | 361/692 |
| 6,411,511 B1 | * | 6/2002 | Chen | 361/697 |
| 6,466,447 B2 | * | 10/2002 | Murowaki et al. | 361/752 |
| 6,774,599 B2 | * | 8/2004 | Ishii | 318/652 |
| 7,085,136 B2 | * | 8/2006 | Lin | 361/712 |
| 7,120,017 B2 | * | 10/2006 | Shieh | 361/695 |
| 7,245,486 B2 | * | 7/2007 | Kumano et al. | 361/679.48 |
| 7,646,597 B2 | * | 1/2010 | Hall et al. | 361/679.33 |
| 7,791,875 B2 | * | 9/2010 | Kumano et al. | 361/679.49 |
| 2002/0186551 A1 | * | 12/2002 | Murowaki et al. | 361/752 |

(Continued)

FOREIGN PATENT DOCUMENTS

DE      20301444         7/2003
DE      202004012584     1/2005

(Continued)

*Primary Examiner* — Khoi Tran
*Assistant Examiner* — Jonathan L Sample
(74) *Attorney, Agent, or Firm* — Harness, Dickey & Pierce, P.L.C.

(57) ABSTRACT

A robot control device that controls operation of a robot having an actuator includes a casing, an actuator driver, a drive-control board, a main control board, a main power supply board, a vent passage, a cooling fan, and a holding member.

3 Claims, 3 Drawing Sheets

(56) References Cited

U.S. PATENT DOCUMENTS

| | | | |
|---|---|---|---|
| 2004/0145869 A1* | 7/2004 | Tanaka et al. | 361/695 |
| 2005/0077847 A1* | 4/2005 | Watanabe | 318/34 |
| 2005/0162828 A1* | 7/2005 | Shieh | 361/695 |
| 2005/0212475 A1* | 9/2005 | Kakutani et al. | 318/567 |
| 2007/0012427 A1* | 1/2007 | Liu et al. | 165/104.26 |
| 2007/0017685 A1* | 1/2007 | Moore et al. | 174/17 VA |

FOREIGN PATENT DOCUMENTS

| | | |
|---|---|---|
| EP | 0 949 856 A2 | 10/1999 |
| EP | 0 951 208 A2 | 10/1999 |
| JP | 62-163995 | 10/1987 |
| JP | 06-204676 | 7/1994 |
| JP | 06-216552 | 8/1994 |
| JP | 06-066062 | 9/1994 |
| JP | 09-028094 | 1/1997 |
| JP | 09-198120 | 7/1997 |
| JP | 11-188686 | 7/1999 |
| JP | 2001-067110 | 3/2001 |
| JP | 2002-353679 | 12/2002 |
| WO | WO 00/76286 A1 | 12/2000 |

\* cited by examiner

ROBOT CONTROL DEVICE AND ROBOT SYSTEM

CROSS-REFERENCE TO RELATED APPLICATIONS

This application is a continuation of U.S. application Ser. No. 11/605,493 filed Nov. 28, 2006. This application claims the benefit of priority from prior Japanese Patent Application No. 2005-344651, filed on Nov. 29, 2005 and Japanese Patent Application No. 2006-170736, filed on Jun. 20, 2006, the entire contents of which are incorporated herein by reference.

BACKGROUND

The present invention relates to a robot control device and a robot system.

Typically, an industrial robot system includes an industrial robot and a robot control device connected to the industrial robot through a power supply cable and a signal cable. As described in JP-A-11-188686 and JP-A-9-198120, the industrial robot receives a signal from the robot control device and operates in accordance with the signal.

To save space in a production facility, it is now desirable to reduce the size of the robot control device. However, since various heat sources including a servo amplifier are stored in a casing of the robot control device, the heat radiating surface area of the casing as a whole must be relatively great so as to cool the heat sources. Alternatively, a large-sized fan may be provided to forcibly cool the interior of the casing. The size of the casing of the robot control device thus becomes large, which makes miniaturization of the robot control device difficult. Further, the above-described two publications do not teach a cooling structure that operates in correspondence with the amount of the heat generated by the heat sources.

JP-A-6-216552 has proposed a technique that improves cooling efficiency of such electronic devices. Specifically, electronic element mounting surfaces of print circuit boards, each of which is arranged in the vicinity of a side surface of a casing, are oriented in such a manner as to face inward with respect to the casing. This orientation exposes the electronic elements in the vicinity of the side surfaces of the casing to the cooling air flowing at an increased flow rate. This enhances the cooling efficiency of the print circuit boards. Alternatively, as described in JP-A-2002-353679, a cooling duct having a vent hole is provided in the casing. A plurality of heat lanes extend from the cooling duct. A servo amplifier, a power supply, and a transformer are connected to the corresponding ones of the heat lanes. This arrangement permits transportation of a large amount of heat through the heat lanes, improving cooling efficiency of the heat generating bodies.

Nonetheless, in the technique of JP-A-6-216552, improvement of the cooling efficiency is not achieved in the entire portion of the interior of the casing but restricted to the vicinity of the side surfaces of the casing. In JP-A-2002-353679, the cooling duct, which is provided independently, enlarges the size of the casing, making it impossible to reduce the size of the robot control device.

SUMMARY

Accordingly, it is an objective of the present invention to provide a robot control device that improves cooling efficiency and has reduced size and a robot system including such robot control device.

In accordance with a first aspect of the present invention, a robot control device that controls operation of a robot having an actuator. The device includes a casing, an actuator driver that is accommodated in the casing and drives the actuator, a drive-control board that is accommodated in the casing and controls operation of the actuator driver, a main control board that is accommodated in the casing and controls operation of the drive-control board, a main power supply board that is accommodated in the casing and supplies a power to the drive-control board and the main control board, a vent passage defined by at least the drive-control board, the main control board, and the main power supply board, the vent passage having an end open to the exterior of the casing, a cooling fan that is arranged at an end of the vent passage and causes the air to flow through the vent passage, and a holding member that is provided in the vent passage and holds the actuator driver.

In accordance with a second aspect of the present invention, a robot control device that controls operation of a robot having an actuator is provided. The device includes an actuator driver that drives the actuator, a drive-control board that controls operation of the actuator driver, a main control board that controls operation of the drive-control board, a main power supply board that supplies a power to the drive-control board and the main control board, a casing that accommodates the actuator driver, the drive-control board, the main control board, and the main power supply board, the casing including four plates that are arranged in such a manner as to form a rectangular pipe, the drive-control board, the main control board, and the main power supply board being each secured to a corresponding one of three of the four plates, a vent passage defined by the drive-control board, the main control board, the main power supply board, and the remaining plate to which none of the boards is attached, the vent passage having an end open to the exterior of the casing, a cooling fan that is arranged at an end of the vent passage and causes the air to flow through the vent passage, and a holding member that is provided in the vent passage and holds the actuator driver.

In accordance with a third aspect of the present invention, a robot system including a robot having an actuator and a control device that controls operation of the robot is provided. The control device includes a casing, an actuator driver that is accommodated in the casing and drives the actuator, a drive-control board that is accommodated in the casing and controls operation of the actuator driver, a main control board that is accommodated in the casing and controls operation of the drive-control board, a main power supply board that is accommodated in the casing and supplies a power to the drive-control board and the main control board, a vent passage defined by at least the drive-control board, the main control board, and the main power supply board, the vent passage having an end open to the exterior of the casing, a cooling fan that is arranged at an end of the vent passage and causes the air to flow through the vent passage, and a holding member that is provided in the vent passage and holds the actuator driver.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EXEMPLARY EMBODIMENTS

An embodiment of the present invention will now be described with reference to FIGS. 1 to 4.

Figure 1:
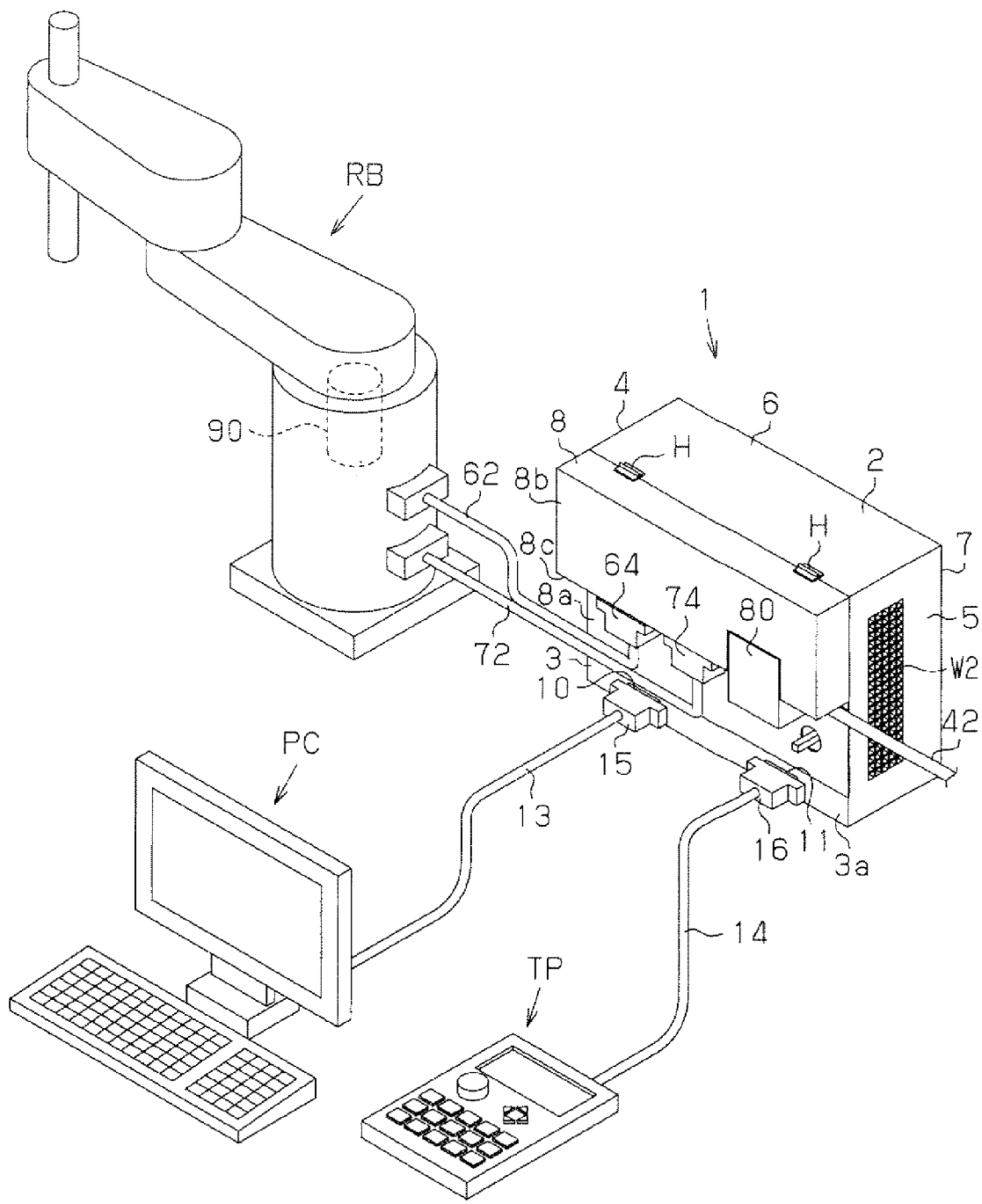
FIG. 1 is a view schematically showing a robot system according to an embodiment of the present invention.

As shown in FIG. 1, a robot system includes a robot RB and a robot controller 1 as a robot control device. The robot RB is a horizontally articulated type four-axis control industrial robot. Operation of the robot RB is controlled by the robot controller 1. A casing 2 of the robot controller 1 is a substantially parallelepiped box-like body. The casing 2 has a base portion 3 that extends in a left-and-right direction. A pair of interface connectors 10, 11 are provided on a front surface 3a of the base portion 3.

A connector 15 of a connection cable 13 is connected to the interface connector 10 and a connector 16 of a connection cable 14 is connected to the interface connector 11. The connection cable 13 and the connection cable 14 are connected to a personal computer PC and a teaching pendant TP, respectively. Information regarding setting of the robot RB, information regarding instructions of the robot RB, drive signals that instructs actuation of the robot RB, and peripheral drive signals that control peripheral functions such as a man-machine interface are input to the personal computer PC and the teaching pendant TP.

Figure 2:
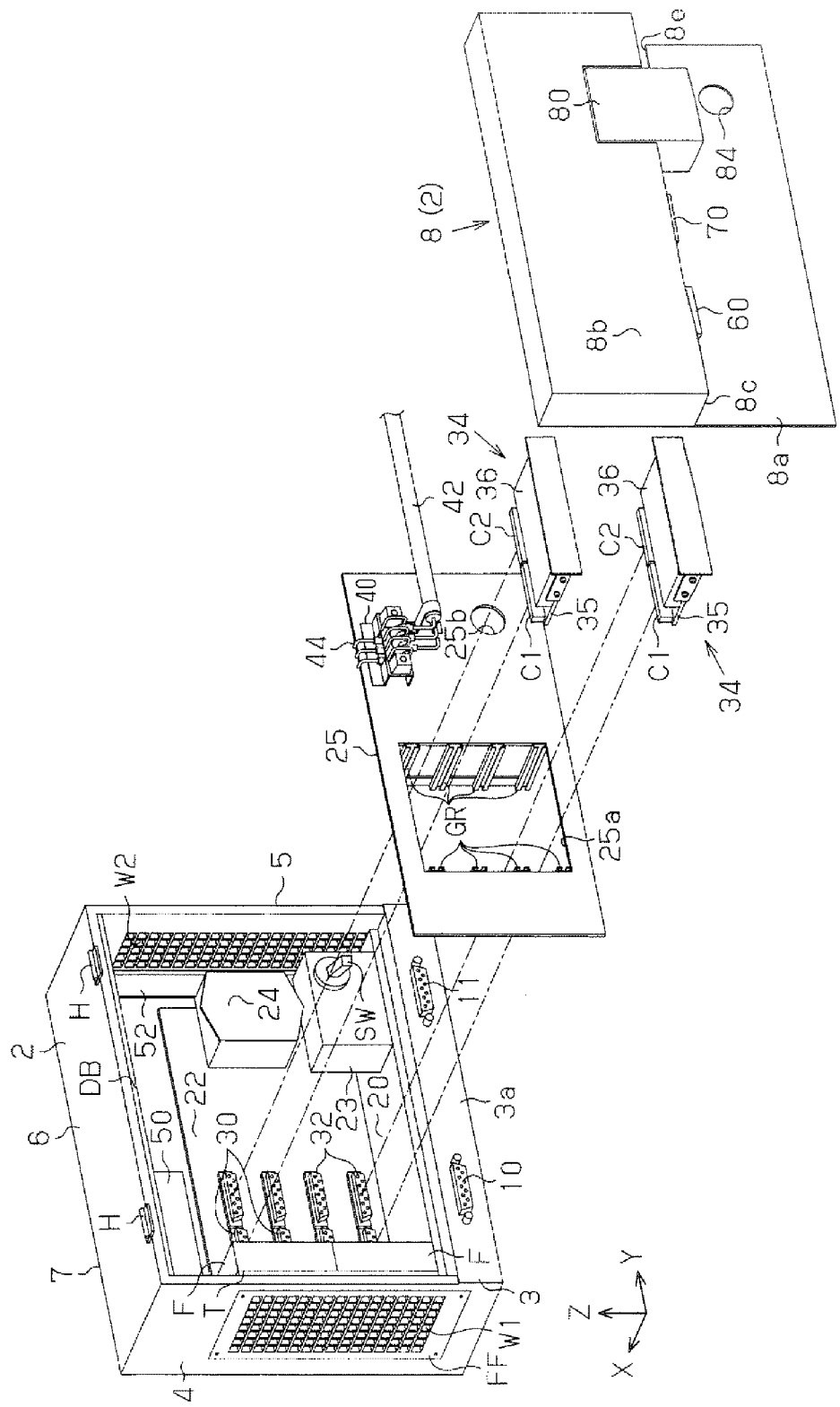
FIG. 2 is an exploded perspective view showing a casing of a robot controller.
Figure 3:
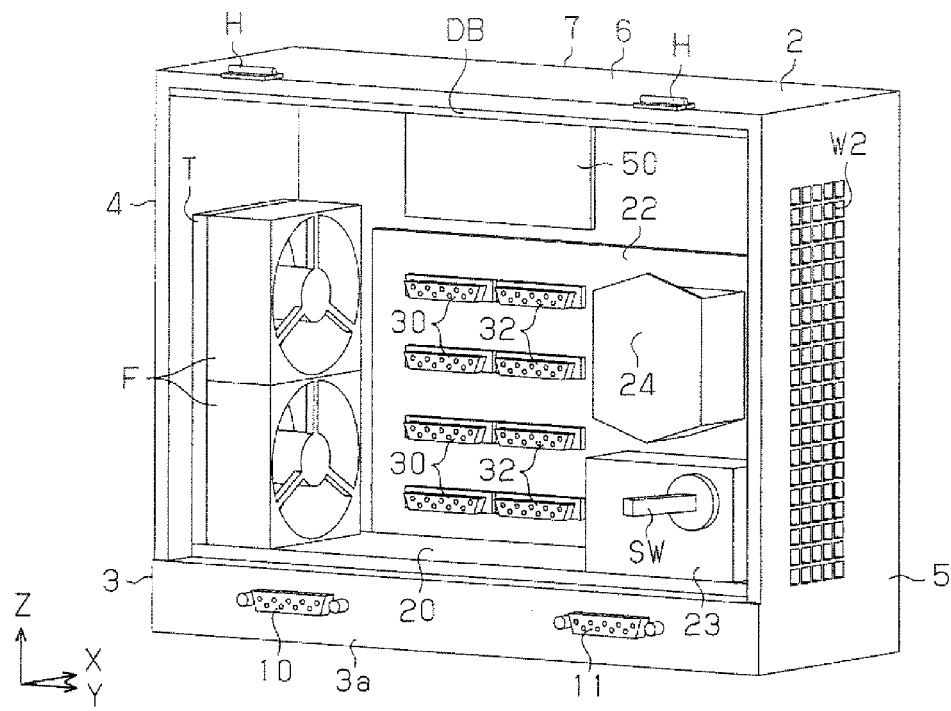
FIG. 3 is a perspective view showing the casing.

As shown in FIG. 2, the casing 2 includes a left side plate 4, a right side plate 5, a top plate 6, a rear side plate, or a back plate 7, and a front side plate, or an open-close panel 8. The base portion 3, the left side plate 4, the right side plate 5, the top plate 6, and the back plate 7 form a box-like body having a front opening. The top side of the open-close panel 8 is connected to the top plate 6 through a hinge H. The open-close panel 8 pivots about the hinge H, the support point, thus selectively opening and closing the front side of the box-like body.

A vent hole W1 is defined in the left side plate 4 and a vent hole W2 is defined in the right side plate 5. A fan filter FF is detachably attached to an outer side surface of the left side plate 4 in such a manner as to cover the vent hole W1. A pair of vertically stacked cooling fans F are secured to an inner side surface of the left side plate 4 through a hollow spacer T. The hollow spacer T ensures a suction distance for the cooling fans F. The cooling fans F each draw the external air from the vent hole W1 to the interior of the casing 2. The drawn air is then forcibly discharged from the vent hole W2. In other words, the external air is drawn from one of the opposing side surfaces of the casing 2 and flows through the casing 2 toward the other side surface (in direction Y of FIG. 2).

A CPU board 20, or a main control board, is secured to the upper surface of the base portion 3, or the bottom plate, in the casing 2. The CPU board 20 is formed as a flat plate that extends in directions X and Y. A surface of the CPU board 20 extends parallel with the air vent direction. This arrangement allows the CPU board 20 to decrease flow resistance in the air vent direction, thus enhancing cooling efficiency. A heat generating surface of the CPU board 20, which is, for example, a mounting surface on which circuit elements are mounted, faces inward with respect to the casing 2. The CPU board 20 is connected to the interface connectors 10, 11 of the base portion 3 and receives various types of information and different types of signals from the personal computer PC and the teaching pendant TP. The CPU board 20 generates position instruction signals in accordance with the drive signals input from the personal computer PC and the teaching pendant TP.

A drive-control board 22 is secured to the inner side surface of the back plate 7 and arranged above the CPU board 20. The drive-control board 22 is formed as a flat plate that extends in directions Y and Z. A surface of the drive-control board 22 extends parallel with the air vent direction. This arrangement allows the drive-control board 22 to decrease flow resistance in the air vent direction, thus enhancing the cooling efficiency. A heat generating surface of the drive-control board 22, which is, for example, a mounting surface on which circuit elements are mounted, faces inward with respect to the casing 2. The drive-control board 22 is electrically connected to the CPU board 20 and receives the position instruction signals from the CPU board 20. Pairs of connectors, or power supply connectors 30 and signal connectors 32, are arranged on a left side portion of the drive-control board 22 and spaced at predetermined intervals, extending in an up-and-down direction. In the illustrated embodiment, the drive-control board 22 has four vertically arranged power supply connectors 30 and four vertically arranged signal connectors 32.

A circuit protector 23 and a noise filter 24 connected to the circuit protector 23 are arranged on a right portion of the drive-control board 22.

A front cover 25 is provided separately from the circuit protector 23 and the noise filter 24. The front cover 25 is arranged substantially parallel with the drive-control board 22. That is, the front cover 25 is also shaped as a flat plate that extends in directions Y and Z. A surface of the front cover 25 extends in the air vent direction. This structure allows the front cover 25 to decrease the flow resistance in the air vent direction. The front cover 25 has a rectangular opening 25a at a position opposed to the power supply connectors 30 and the signal connectors 32. The front cover 25 also has a circular hole 25b at a position opposed to the circuit protector 23. A power supply switch SW of the circuit protector 23 is passed through the hole 25b. Pairs of guide rails GR are arranged at opposing sides of the opening 25a. The pairs of the guide rails GR are spaced at predetermined intervals in the vertical direction and extend perpendicularly from the front cover 25 (in direction X of FIG. 2). Each of the guide rails GR functions as a holding member and holds a corresponding one of motor drivers 34, or actuator drivers. The motor drivers 34 are provided in correspondence with the motors of the robot RB. The motor drivers 34 are provided to correspond to a plurality of motors 90 (only one motor is shown) housed in the robot RB. The motors 90 serve as an actuator. The number of the pairs of the guide rails GR is equal to the number of the motor driver 34. In the illustrated embodiment, the front cover 25 has four pairs of guide rails GR that are vertically arranged. Each pair of the guide rails GR hold the corresponding one of the motor drivers 34.

Each of the motor drivers 34 includes a circuit board 35 and a heat radiating fin 36 mounted on the upper side of the circuit board 35.

Circuit elements such as a servo amplifier are mounted on the circuit board 35. The circuit board 35 is shaped as a flat plate that extends in directions X and Y. A pair of connectors, or a left connector portion C1 and a right connector portion C2, are arranged at an end of the circuit board 35. When each pair of the guide rails GR hold the opposing ends of the corresponding circuit board 35, the motor driver 34 connects the connector portions C1, C2 to the power supply connector 30 and the signal connector 32, respectively. The heat radiating fin 36 is, as a whole, shaped as a flat plate that extends in directions X and Y and includes multiple fins each having a heat radiating surface that extends in directions Y and Z.

With the connector portions C1, C2 connected to the connectors 30, 32, respectively, the surface of the circuit board 35 extends parallel with the air vent direction. In this state, the heat radiating surfaces of the heat radiating fin 36 also extend parallel with the air vent direction. This arrangement allows the motor drivers 34, in the state connected to the drive-control board 22, to reduce the flow resistance in the air vent direction, thus improving the cooling efficiency. Each of the motor drivers 34 is removed from the casing 2 by retrieving the motor drivers 34 in a forward direction with respect to the casing 2.

A power input terminal 40 is secured to a right side portion of the opening 25a of the front cover 25. The power supply cable 42 is electrically connected to the power input terminal 40. The power input terminal 40 thus receives AC power from an external power supply (not shown). Internal input lines 44 are secured to the power input terminal 40. The internal input lines 44 extend to the backside of the front cover 25 and are electrically connected to the noise filter 24.

A main power supply board DB is secured to the inner side surface of the top plate 6. The main power supply board DB is shaped as a flat plate that extends in directions X and Y. A surface of the main power supply board DB extends parallel with the air vent direction. This arrangement allows the main power supply board DB to decrease the flow resistance in the air vent direction, thus enhancing the cooling efficiency. A heat generating surface of the main power supply board DB, which is, for example, a mounting surface on which circuit elements are mounted, faces inward with respect to the casing 2. The main power supply board DB is electrically connected to the circuit protector 23 through a non-illustrated connection cable. The circuit protector 23 supplies the AC power to the main power supply board DB from an external power supply. The main power supply board DB distributes the AC power to the CPU board 20 and the drive-control board 22.

A first switching power supply board 50 is secured to the drive-control board 22. The first switching power supply board 50 is shaped as a flat plate that extends in directions Y and Z. A surface of the first switching power supply board 50 extends parallel with the air vent direction. This arrangement allows the first switching power supply board 50 to decrease the flow resistance in the air vent direction, improving the cooling efficiency. A heat generating surface of the first switching power supply board 50, which is, for example, a mounting surface on which circuit elements are mounted, faces inward with respect to the casing 2. The upper end of the first switching power supply board 50 is electrically connected to the main power supply board DB and the lower end of the first switching power supply board 50 is electrically connected to the drive-control board 22. The first switching power supply board 50 converts the AC power provided by the main power supply board DB into DC power and supplies the DC power to the drive-control board 22.

A second switching power supply board 52 is secured to the inner side surface of the right side plate 5. The second switching power supply board 52 is arranged in such a manner as to ensure opening of the vent hole W2. A heat generating surface of the second switching power supply board 52, which is, for example, a mounting surface on which circuit elements are mounted, faces inward with respect to the casing 2. The upper end of the second switching power supply board 52 is electrically connected to the main power supply board DB and the lower end of the second switching power supply board 52 is electrically connected to the CPU board 20. The second switching power supply board 52 converts the AC power provided by the main power supply board DB into DC power and supplies the DC power to the CPU board 20.

The CPU board 20, the drive-control board 22, the main power supply board DB, the first switching power supply board 50, and the second switching power supply board 52, which are accommodated in the casing 2, cooperate with the front cover 25, thus defining a substantially linear vent passage having a rectangular cross-sectional shape. Referring to FIG. 2, the opposing ends of the vent passage correspond to the vent holes W1, W2 and are open to the exterior of the casing 2. Each of the boards is arranged in such a manner that the heat generating surface of the board faces the vent passage and extends parallel with the air vent direction. This reduces the flow resistance in the flow passage. The heat radiating surface of each of the motor drivers 34 also extends in the air vent direction and is exposed to the vent passage.

In other words, when the cooling fans F send the air to the vent passage, the boards reduce the flow resistance in the vent passage and facilitate the air flowing at increased flow rate in the vent passage. The entire portion of the heat generating surface of each board is thus exposed to the air flowing at the increased flow rate. Also, the entire portion of each of the upper and lower surfaces of each motor driver 34 is exposed to the air flowing at the increased flow rate.

As a result, the boards and the motor drivers 34 efficiently perform heat exchange using the air drawn by the cooling fans F, thus improving the cooling efficiency. Further, in the motor drivers 34, heat exchange occurs on the upper surface and the lower surface of the motor driver 34. The motor driver 34, which generates a great amount of heat, is thus further effectively cooled. Also, since the vent passage is defined by a single side surface of each board, the vent passage is sized in correspondence with the sizes of the boards without becoming excessively large.

Therefore, without providing a large-sized cooling fan or a separate cooling duct, the interior of the casing 2 is efficiently cooled. The size of the robot controller 1 is thus reduced.

Figure 4:
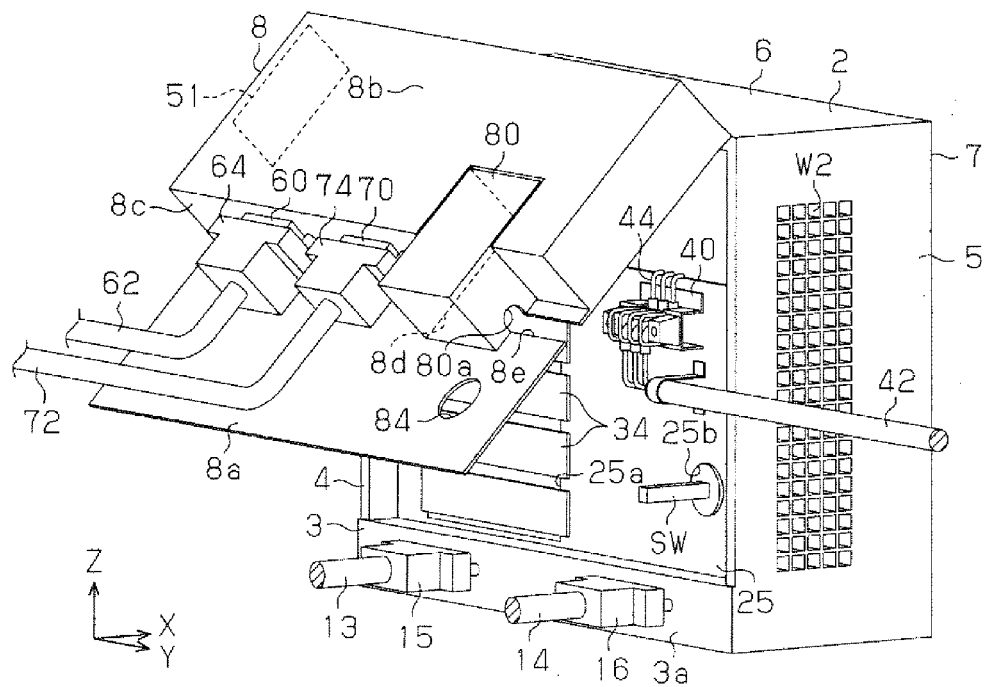
FIG. 4 is a perspective view showing a portion of the robot controller.

As shown in FIG. 4, the open-close panel 8 is bent in a stepped shape. The open-close panel 8 thus has a front surface 8a, a projection 8b, and a stepped surface 8c. The projection 8b extends along the entire width of the front surface 8a and projects in a normal direction of the front surface 8a. The stepped surface 8c is one of the side surfaces of projection 8b and extends in a normal direction of the front surface 8a. A relay board 51 and a non-illustrated third switching power supply board are provided behind the projection 8b.

A pair of connectors, or the power supply connector 60 and the signal connector 70, are arranged on the stepped surface 8c of the projection 8b. The power supply connector 60 and the signal connector 70 are electrically connected to the relay board 51, which is provided on an inner side of the projection 8b. The relay board 51 is connected to the drive-control board 22 through a non-illustrated internal power supply line and a non-illustrated internal signal line. The length of the internal power supply line and the length of the internal signal line are selected in such a manner as to prevent interference with the open-close panel 8 when the open-close panel 8 opens or closes.

The power supply connector 60 of the panel 8 is electrically connected to a connector of a power connection cable 62 of the robot RB, or a power supply connector 64, outside the projection 8b. The signal connector 70 of the panel 8 is electrically connected to a connector of a signal connection cable 72 of the robot RB, or a signal connector 74, outside the projection 8b. When the power supply connector 60 is connected to the power supply connector 64, the power connection cable 62 extends from the power supply connector 64 in a normal direction of the stepped surface 8c, or in a direction parallel with the front surface 8a. When the signal connector 70 is connected to the signal connector 74, the signal connection cable 72 extends from the signal connector 74 in a normal direction of the stepped surface 8c, or in a direction parallel with the front surface 8a.

This arrangement prevents the cables 62, 72 of the robot controller 1 from projecting forward (in the direction opposite to direction X) from the casing 2 when the robot RB is in operation. As a result, even if the cables 62, 72 exhibit poor flexibility, the space occupied by the robot controller 1 is reduced.

A hole 8d through which the power input terminal 40 passes is defined at a position opposed to the terminal 40 and extends through the front surface 8a of the open-close panel 8. A slit 8e extends from the hole 8d to the right side end of the open-close panel 8. A cup-shaped cover case 80 covers the hole 8d. A recess 80a is defined at the right side of the cover case 80 and extends continuously from the slit 8e. When the open-close panel 8 is held in a closed state, the slit 8e and the recess 80a are engaged with the power supply cable 42. This arrangement allows the power supply cable 42 to smoothly extend to the exterior of the open-close panel 8 regardless of whether the open-close panel 8 is held in an open state or the closed state.

A circular through hole 84 is defined in the front surface 8a of the open-close panel 8 and arranged below the cover case 80. A power supply switch SW of the circuit protector 23 is passed through the through hole 84. This allows manipulation of the power supply switch SW from outside the casing 2.

Next, operation of the robot controller 1, which has the above-described configuration, will be explained.

With reference to FIG. 1, the personal computer PC and the teaching pendant TP are connected to the robot controller 1 through the connection cables 13, 14. Further, the robot RB is connected to the robot controller 1 through the connection cable 62 and the cable 72.

When the power supply switch SW of the robot controller 1 is turned on and the power is supplied to the robot controller 1, the cooling fans F start operating. When prescribed drive signals are input from the personal computer PC and the teaching pendant TP to the robot controller 1, the robot controller 1 generates a position instruction signal in correspondence with the drive signals and controls operation of the robot RB in accordance with the position instruction signal.

Meanwhile, the boards, which are the CPU board 20, the drive-control board 22, the main power supply board DB, the first switching power supply board 50, and the second switching power supply board 52, and the motor drivers 34 continuously generate heat from the circuit elements mounted on the boards and the motor drivers 34.

In this state, the cooling fans F continuously draw the air through the vent hole W1 and discharge the air through the vent hole W2. Since the surfaces of the boards extend parallel with the air vent direction in this state, the air flows at an increased flow rate. The heat generating surfaces of the boards and the upper and lower surfaces of the motor drivers 34 are exposed to the air flowing at the increased flow rate. That is, the boards and the motor drivers 34 are further efficiently cooled through heat exchange occurring in correspondence with the respective heat generation amounts.

As a result, the air drawn by the cooling fans F achieves efficient heat exchange in the robot controller 1, thus enhancing the cooling efficiency.

The illustrated embodiment has the following advantages.

The CPU board 20, the drive-control board 22, and the main power supply board DB are secured to the inner side surface of the base portion 3, the back plate 7, and the top plate 6, respectively, and define the vent passage. The motor drivers 34, which generate a great amount of heat, are provided in the vent passage. The vent holes W1, W2 are defined in the side plates 4, 5. The cooling fans F are provided in the vent passage and cause the air to flow through the vent passage.

Therefore, the surfaces of the boards extend parallel with the air vent direction and thus reduce the flow resistance in the vent passage. Further, since the vent passage is defined by one of the side surfaces of each board, the vent passage is sized in correspondence with the sizes of the boards without becoming excessively large. As a result, the interior of the casing 2 is efficiently cooled without providing a large-sized cooling fan or a separate cooling duct. This reduces the size of the robot controller 1.

Also, each of the motor drivers 34, which generate a large amount of heat, is entirely exposed to the air flow. The components are thus cooled in correspondence with the amount of the heat generated by themselves, further enhancing the cooling efficiency of the robot controller 1.

The first switching power supply board 50 is arranged between and connected to the main power supply board DB and the drive-control board 22. The second switching power supply board 52 is arranged between and connected to the main power supply board DB and the CPU board 20. This arrangement shortens the length of the cables extending between the boards. The size of the robot controller 1 is thus further reduced.

The open-close panel 8 is selectively opened and closed through the hinge H. The drive-control board 22 is secured to the back plate 7. The motor drivers 34 are attachable and detachable in a rearward direction and a forward direction. Therefore, simply by opening the open-close panel 8, the motor drivers 34 are replaced easily. This facilitates maintenance of the robot controller 1.

The open-close panel 8 has the stepped surface 8c and the connectors 60, 70 are secured to the stepped surface 8c. This allows the cables 62, 72 to extend along the front surface 8a. In other words, the cables 62, 72 (the connectors 64, 74) are prevented from projecting forward. This reduces the space occupied by the robot controller 1.

The connection state of the connectors 60, 64 and the connection state of the connectors 70, 74 are visible simply by opening the open-close panel 8. This facilitates attachment and detachment of the connectors 64, 74.

The connection cables 13, 14 are connected to the front surface 3a of the base portion 3. The power supply cable 42 is connected to the front cover 25. This arrangement allows attachment and detachment of all the cables 13, 14, 42, 62, 72 and the motor drivers 34 from the front side of the robot controller 1. The maintenance of the robot controller 1 is thus further facilitated.

The illustrated embodiment may be modified in the following forms.

As long as the CPU board 20, the drive-control board 22, and the main power supply board DB are arranged in such a manner as to define the vent passage, each of the boards 20, 22, DB may be attached to any one of the base portion 3, the back plate 7, and the top plate 6. For example, the CPU board 20 may be secured to the inner side surface of the top plate 6 and the main power supply board DB may be secured to the base portion 3.

The first and second switching power supply boards 50, 52 may be secured to any ones of the side plates of the casing 2, other than the back plate 7 and the right side plate 5. For example, the first switching power supply board 50 may be secured to the top plate 6 on which the main power supply board DB is arranged. The second switching power supply board 52 may be secured to the top plate 6 on which the main power supply board DB is arranged or the bottom plate 3 on which the main control board 20 is provided.

As long as the motor drivers 34 are arranged in the vent passage, the motor drivers 34 may be aligned in any suitable direction.

The stepped surface 8c may be omitted.

Any side plate of the casing 2 other than the front side plate may be selectively opened and closed. Alternatively, all of the side plates of the casing 2 may be held in a closed state.

The power supply connection cable 62 and the signal connection cable 72 may be formed by a single common cable.

Any suitable devices other than the personal controller PC and the teaching pendant TP, for example an emergency stop switch and a programmable logic controller, may be connected to the robot controller 1.

The robot RB is not restricted to the horizontally articulated type four-axis control industrial robot but may be, for example, a single-axis or two-axis or three-axis control industrial robot or five-or-more-axis control industrial robot (for example, a vertically articulated type six-axis control industrial robot). In these cases, the motor drivers 34 corresponding to the motors 90 housed in the robot RB are installed in the robot controller 1.

The present examples and embodiments are to be considered as illustrative and not restrictive and the invention is not to be limited to the details given herein, but may be modified within the scope and equivalence of the appended claims.

What is claimed is:

1. A robot control device that controls operation of a robot having an actuator, the device comprising:
   an actuator driver that drives the actuator;
   a cover;
   a drive-control board that controls operation of the actuator driver;
   a control board that controls operation of the drive-control board;
   a power supply board that supplies power to the drive-control board and the control board;
   a vent passage defined by the drive-control board, the control board, the power supply board, and the cover, each of which serves as a side wall of a passage so that the vent passage has a rectangular cross section and extends substantially linearly;
   a cooling fan that is arranged at an end of the vent passage and causes air to flow through the vent passage; and
   a holding member that is provided in the vent passage and holds the actuator driver,
   wherein the holding member is provided on the cover.

2. The device according to claim 1, wherein the actuator driver has a heat radiating surface, and wherein the holding member holds the actuator driver so that the heat radiating surface extends substantially parallel with an air vent direction in the vent passage.

3. The device according to claim 1, wherein the cover has an opening through which the actuator driver is removable, and wherein the opening is selectively opened and closed with a side plate.

* * * * *